United States Patent
Koehler et al.

(10) Patent No.: US 9,018,106 B1
(45) Date of Patent: Apr. 28, 2015

(54) FILM DEPOSITION WITH IMPROVED IN-WAFER UNIFORMITY

(71) Applicant: GLOBALFOUNDRIES Inc., Grand Cayman (KY)

(72) Inventors: Fabian Koehler, Dresden (DE); Itasham Hussain, Dresden (DE); Bianca Antonioli-Trepte, Stolpen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/097,909

(22) Filed: Dec. 5, 2013

(51) Int. Cl.
  *H01L 21/31* (2006.01)
  *H01L 21/02* (2006.01)
  *H01L 21/762* (2006.01)

(52) U.S. Cl.
  CPC .... *H01L 21/02271* (2013.01); *H01L 21/76224* (2013.01); *H01L 21/02164* (2013.01); *H01L 21/0217* (2013.01); *H01L 21/02277* (2013.01); *H01L 21/02263* (2013.01); *H01L 21/02225* (2013.01)

(58) Field of Classification Search
  CPC .......... H01L 21/02109; H01L 21/02123; H01L 21/02225; H01L 21/0226; H01L 21/02277; H01L 21/02296; H01L 21/285; H01L 21/3147
  See application file for complete search history.

(56) References Cited

U.S. PATENT DOCUMENTS

| 6,461,979 | B1 | 10/2002 | Lin et al. |
| 6,537,677 | B1 | 3/2003 | Mercaldi et al. |
| 2009/0246371 | A1 | 10/2009 | Koehler et al. |

OTHER PUBLICATIONS

Koehler et al., U.S. Appl. No. 13/942,829, filed Jul. 16, 2013.

*Primary Examiner* — Cheung Lee
(74) *Attorney, Agent, or Firm* — Amerson Law Firm, PLLC (57) ABSTRACT

A method of forming a material layer on a substrate is provided. The method is based on a combination of an overheating before deposition and a cooling of the reaction chamber during a second deposition stage. The second deposition stage follows a first deposition stage preferably carried out at a predetermined temperature. This combination makes it possible to compensate for the reactant gas depletion across wafer throughout the whole deposition process. The method can be conveniently used when growing a nitride layer to be used as a hard mask during shallow trench isolation (STI) region formation.

20 Claims, 11 Drawing Sheets

FILM DEPOSITION WITH IMPROVED IN-WAFER UNIFORMITY

BACKGROUND OF THE INVENTION

1. Field of the Invention

Generally, the present disclosure relates to formation of thin films on a substrate. More specifically, the present disclosure relates to formation of thin dielectric films on substrates achieved by using chemical vapor deposition (CVD) techniques. Yet more specifically, the present disclosure is concerned with CVD techniques used during fabrication of microstructure devices, such as integrated circuits and the like.

2. Description of the Related Art

The ongoing trend in electronic towards more and more complex integrated circuits requires the dimensions of electronic devices to decrease, in order to achieve an ever increasing integration density.

Transistors are the dominant circuit elements in current integrated circuits. Currently, several hundred millions of transistors may be provided in presently available complex integrated circuits such as microprocessors, CPUs, storage chips, and the like. It is then crucial that the typical dimensions of the transistors included in an integrated circuit are as small as possible, so as to enable a high integration density.

Among the various fabrication technologies of integrated circuits, the MOS (metal-oxide-semiconductor) technology is currently the most promising approach, since it enables producing devices with superior characteristics in terms of operating speed, power consumption and cost efficiency. The CMOS (complementary metal-oxide-semiconductor) technology is a particular implementation of the MOS technology wherein pairs of complementary field-effect transistors (FETs), i.e., p-channel transistor and an n-channel transistors grouped in pairs, are used for forming circuit elements, such as inverters and other logic gates to design highly complex circuit assemblies.

During the fabrication of complex integrated circuits using CMOS technology, millions of FETs are formed in active regions defined within a semiconductor layer supported by a substrate. An active region is to be understood as an area of the semiconductor layer within which and on top of which a FET is formed.

Presently, the layer in which most integrated circuits are formed is made out of silicon, which can be provided in crystalline, polycrystalline or amorphous form. Other materials such as, for example, dopant atoms or ions may be introduced into the original semiconductor layer.

A MOS transistor or generally a FET, irrespective of whether an n-channel transistor or a p-channel transistor is considered, comprises a source and a drain region, highly doped with dopants of the same species. An inversely or weakly doped channel region is then arranged between the drain and the source regions. The conductivity of the channel region, i.e., the drive current capability of the conductive channel, can be controlled by a gate electrode formed in the vicinity of the channel region and separated therefrom by a thin insulating layer. The conductivity of the channel region depends, among others, on the mobility of the charge carriers, and on the distance along the transistor width direction between the source and drain regions, which is also referred to as channel length. For example, by reducing the channel length, the channel resistivity decreases. Thus, an increased switching speed and higher drive current capabilities of a transistor can be achieved by decreasing the transistor channel length.

In order to manufacture a transistor, and specifically a FET, a plurality of operations on the semiconductor substrate are carried out including: deposition of layers of different materials, patterning of the deposited layers, etching, ion implantations, surface polishing and planarization, etc.

Film deposition lies at the base of the semiconductor manufacturing process. Therefore, depositing material layers on a semiconductor substrate or on active region surfaces with substantially uniform properties is of a paramount importance for fabricating high-performance electronic devices. It is particularly desirable that the deposited material layers are highly conformal, i.e., that the maximum thickness difference across the whole layer is less then approximately 5%. Ideally, material layers with a uniform thickness all across the substrate are desirable.

Currently, one of the most widespread deposition techniques of thin material layers used in the semiconductor industry is CVD. Since usually highly uniform layers have to be formed, low-pressure CVD (LPCVD) is often preferred to conventional CVD. Reduced pressures tend to reduce undesired gas reactions, thereby improving the layer uniformity across the substrate.

Figure 1A:
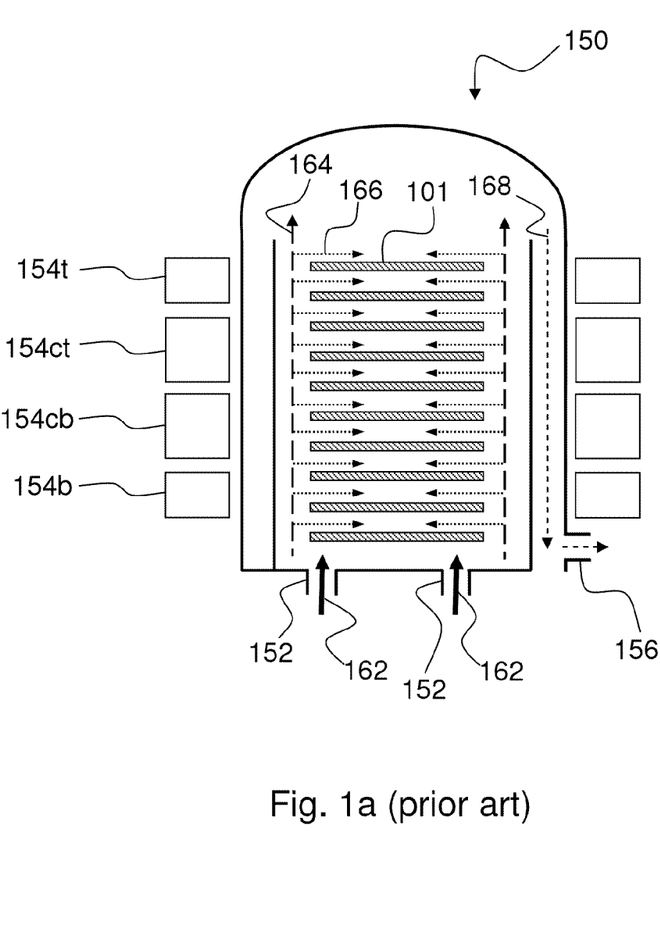
FIG. 1a schematically shows a cross-section of a reaction chamber used for deposition of a material layer.

FIG. 1a schematically shows a cross-section of a reaction chamber 150 used for a typical CVD or LPCVD film growth. Before initiating the deposition process, a plurality of substrates 101 is introduced into reaction chamber 150. Substrates 101 may be any carrier appropriate for supporting a semiconductor device. Substrates 101 are usually stacked upon each other along a direction which is parallel to the longitudinal axis of reaction chamber 150.

After inserting substrates 101 into reaction chamber 150, a gaseous ambient is then established inside reaction chamber 150 by using appropriate means (not shown) for maintaining a gas flow 164, 166, 168. Incoming gases 162 can be introduced into reaction chamber 150 through inlets 152. Upon entering reaction chamber 150, gases 162 mainly flow along the direction indicated by arrows 164. A certain amount of incoming gases 162 flows from main flow direction 164 to the surface of substrates 101, as indicated by arrows 166. It should be noticed that the gases in flow directions 166 mainly flow from the edge to the center of substrates 101.

Before starting the deposition, incoming gases 162 typically include an inert species, such as nitrogen ($N_2$) and the like. Deposition is then initiated by adjusting the composition of incoming gases 162 so as to include appropriate reactant gases. The particles of reactant gases 162 reaching the surface of substrates 101 are then absorbed on the surface, subsequently undergoing surface diffusion and chemical reactions with surface species resulting in film formation. The gaseous by-products of the reactions are desorbed from substrates 101 and removed from reaction chamber 150 through a gas outlet 156. The path followed by exhaust gases is approximately represented by arrows 168.

The energy to drive the chemical reactions leading to film formation can be provided in several manners. However, thermal energy is the most frequently provided source of energy.

Reaction chamber 150 shown in FIG. 1a includes four heating elements 154b, 154cb, 154ct and 154t, each of which is designed in order to establish gaseous ambient 164, 166, 168 within reaction chamber 150 at a predetermined, respective process temperature. The four heating elements are stacked upon each other and can be maintained at different temperatures. Thus, heating elements 154b, 154cb, 154ct and 154t divide reaction chamber 150 into four different process temperature zones.

In general, the term "process temperature" should be understood throughout the disclosure as indicating the temperature of the interior of reaction chamber 105, i.e., of heating elements 154b, 154cb, 154ct and 154t, the gases flowing inside reaction chamber 150 and all other components of reaction chamber 150 in contact with the heating elements. With a certain degree of approximation, the process temperature in each zone may be considered to be approximately equal to the temperature of the corresponding heating element. It should be appreciated that the process temperature might not be the temperature of the substrate of surfaces 101, since upon a temperature variation thermal equilibrium might not be fully established across substrates 101.

It is customary to keep the four heating elements at gradually increasing temperatures when moving from bottom heating element 154b to top heating element 154t. For example, the temperature difference between top heating element 154t and bottom heating element 154b could be of approximately 40-50° C. Different temperature zones are established in reaction chamber 150 in order to compensate for the reaction gas depletion when moving from the bottom (closer to gas inlets 152) to the top (farther from gas inlets 152) of reaction chamber 150.

Figure 1B:
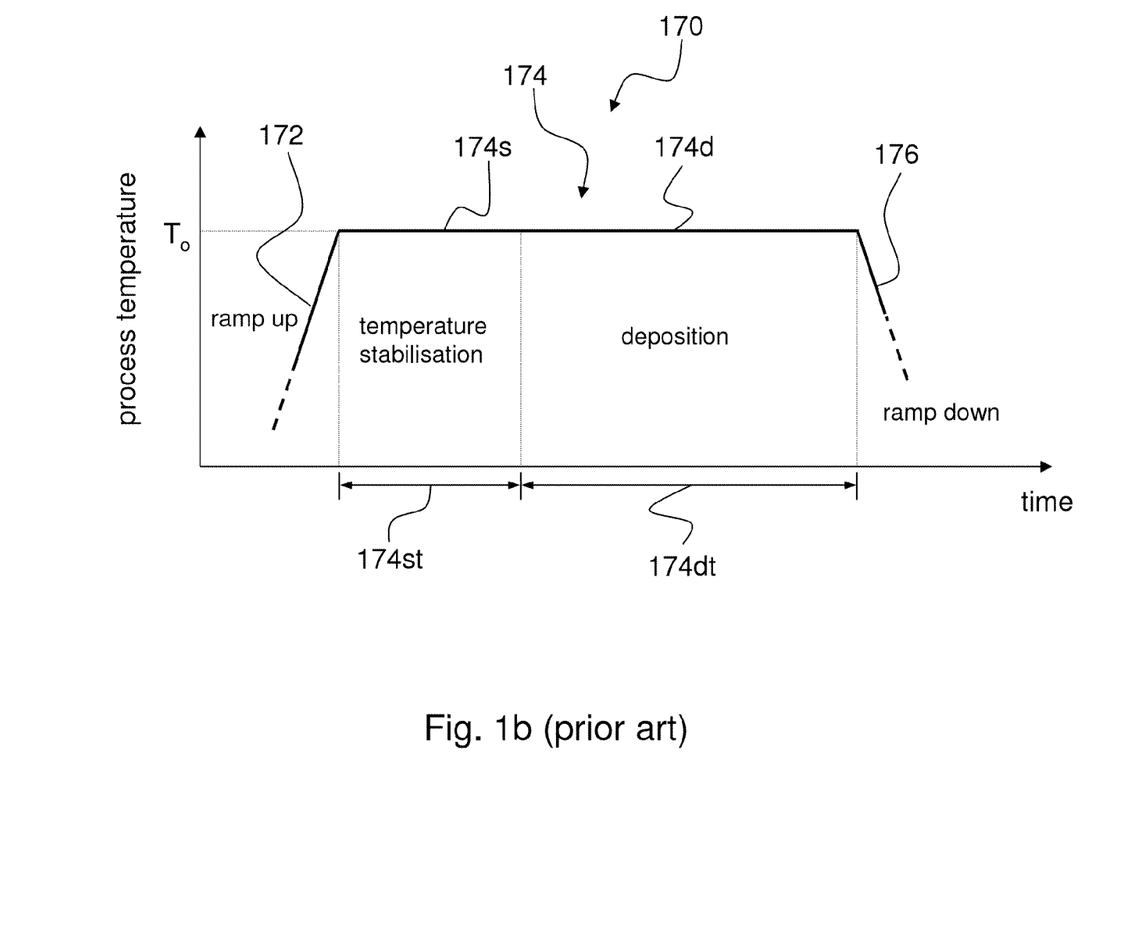
FIG. 1b shows a graph of reaction chamber temperature profile as a function of time for a deposition process according to the prior art.

Line 174 shown in FIG. 1b is a plot of the process temperature profile within a region of a reaction chamber as a function of process time during a conventional growth process. Line 174 could for example represent the temperature of one of heating elements 154b, 154cb, 154ct, 154t of reaction chamber 150 shown in FIG. 1a and the region of the reaction chamber could be one of the four temperature zones of reaction chamber 150. During segment 172 of line 170, the reaction chamber temperature is ramped up to a predetermined operation temperature $T_o$. As said above, operation temperature $T_o$ may be different in different areas of the reaction chamber. During temperature ramp-up segment 172 an inert gas, such as $N_2$, may flow in the reaction chamber.

After reaching operation temperature $T_o$, this is maintained as indicated by the horizontal segment 174 of line 170. More specifically, first portion 174s of segment 174 indicates a time interval 174st during which the temperature is stabilized across the substrates loaded in the reaction chamber. At the end of time interval 174st, deposition is initiated and continued for a time interval 174dt, as shown by the second portion 174d of segment 174.

After completing the deposition, the process temperature in the reaction chamber is ramped down, as indicated by segment 176 of line 170. The reaction chamber may be purged by allowing an inert gas to flow therein during temperature ramp-down 176. Finally, the substrates can be removed from the reaction chamber.

During deposition, the temperature is substantially homogenous across a given substrate and is approximately equal to operation temperature $T_o$. In these conditions, thin layer growth turns out to be inhomogeneous across the substrate surface, resulting in a layer with a greater thickness at the substrate edge and a reduced thickness at the substrate center. Consequently, the grown layer has a characteristic bowl-like shape. This is mainly due to the depletion of reactant gases when flowing from the edge to the center of substrates, for example as indicated by arrows 166 in FIG. 1a.

When manufacturing semiconductor electronic devices, deposition of conformal thin nitride layers, especially silicon nitride ($Si_3N_4$), has in the last decades assumed an increasing importance. $Si_3N_4$ is for example used for forming spacer structures on the sidewalls of gate structures, which are particularly crucial circuit elements for protecting sensitive layers included in gate structures formed according to the high-k/metal gate (HKMG) technology. In this case, one or more highly conformal $Si_3N_4$ layers are deposited on a semiconductor layer after forming the gate structure. The deposited $Si_3N_4$ layers are then patterned in order to assume the desired shape.

One more case for which depositing homogeneous nitride layers is a critical issue is during formation of isolation structures in the device substrate. Isolation structures electrically and spatially isolate neighboring active regions. For current manufacturing technologies, isolation structures are formed by using the so-called shallow trench isolation (STI) technique. Nitride layers are used within the STI techniques as "hard masks" protecting the below-lying active region. Nitride layers are used also as stop layers for chemical mechanical polishing processes carried out in order to remove excess oxide material when forming STI regions.

A typical process flow followed when forming STI structures is schematically illustrated in FIGS. 1c-1h.

Figure 1C:
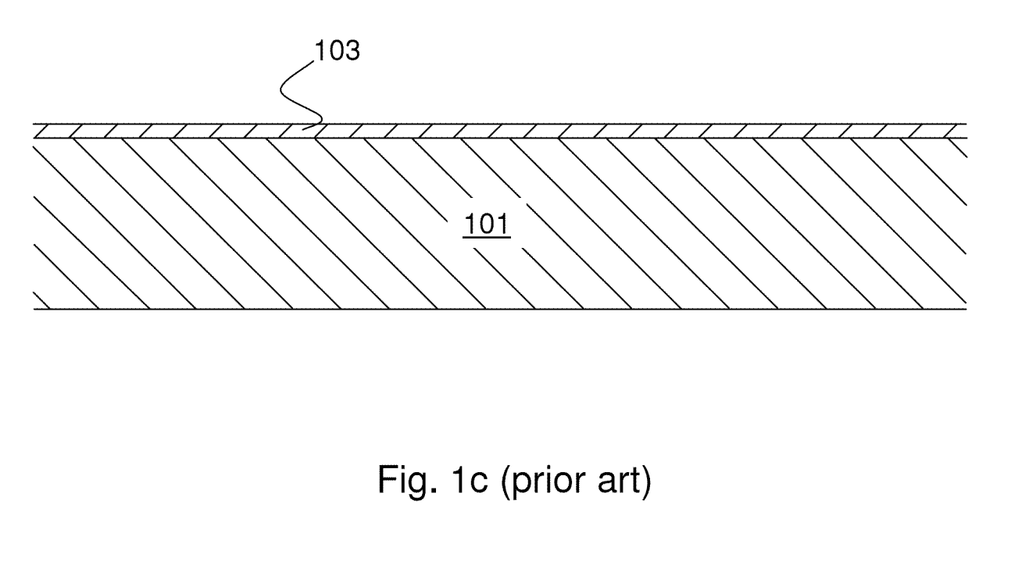
FIG. 1c-1h show cross-sectional views of the same portion of a substrate for a semiconductor device during subsequent stages of a device manufacturing flow leading to formation of an isolation structure.

FIG. 1c shows a cross-section of a portion of a substrate 101 for a semiconductor electronic micro-device. A thin oxide film 103, normally called "pad oxide", has been formed on the surface of substrate 101, for example by means of a thermal growth. The purpose of pad oxide 103 is reducing the stress applied by the above-lying deposited layers to substrate 101.

Figure 1D:
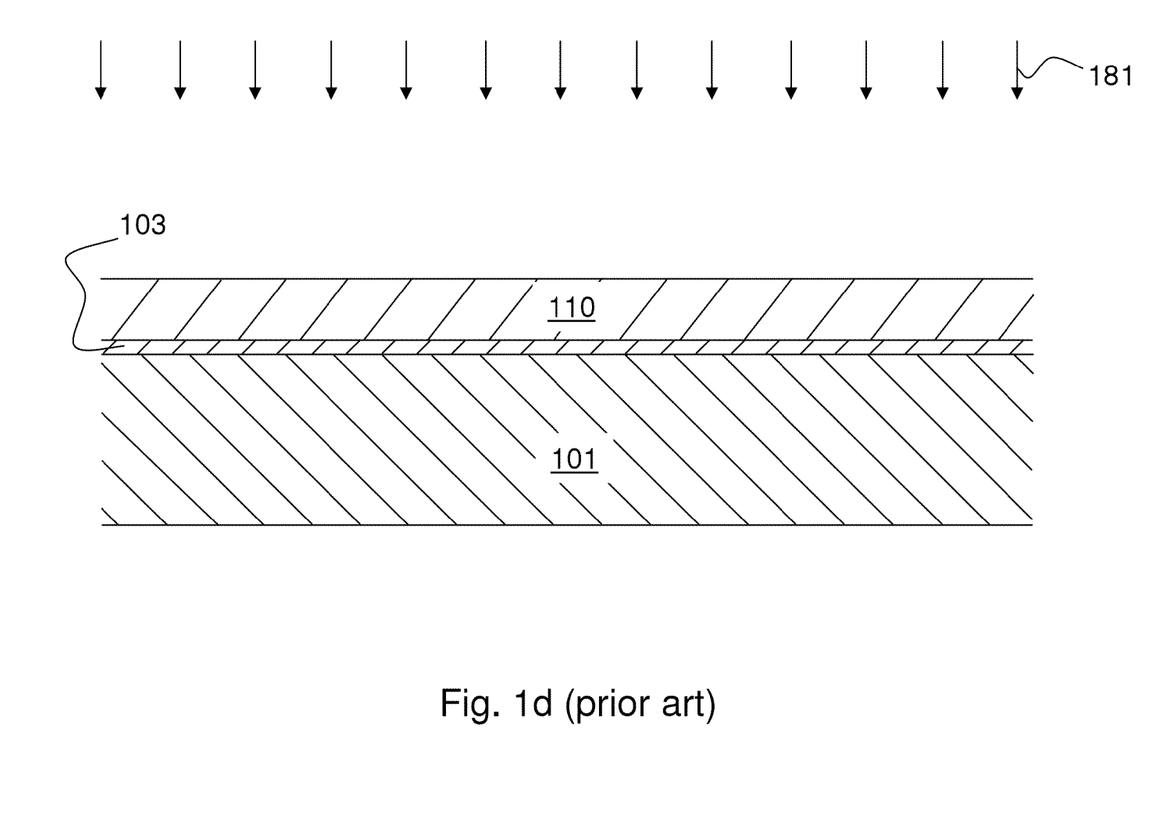

Subsequently, as shown in FIG. 1d, a deposition 181 is performed in order to form a nitride layer 110, typically $Si_3N_4$, on the upper surface of pad oxide 103. Deposition 181 is usually a CVD or LPCVD carried out as described above with reference to FIGS. 1a and 1b. When forming nitride ($Si_3N_4$) layer 110 shown in FIG. 1d, the reactant gases 162 introduced into reaction chamber 150 shown in FIG. 1a normally include ammonia ($NH_3$) and dichlorosilane ($SiH_2Cl_2$). Again with reference to FIG. 1d, nitride layer 110 has normally a thickness greater than approximately 70 nm. For advanced semiconductor manufacturing technologies such as the 45-nm or 28-nm technologies, the thickness of nitride layer 110 can be of approximately 80 nm.

Thereafter, nitride layer 110 is patterned in order to form a hard mask with openings in predetermined points of the layer exposing the surface of substrate 101. Openings are positioned above the substrate areas in which the STI structures are to be formed. Patterning of nitride layer 110 usually involves a photolithographic process wherein a pattern is formed on a photoresist deposited on the surface on the surface of nitride layer 110. Pattern formation in the photoresist is then followed by an etching process performed in order to transfer the pattern onto the nitride layer 110.

Figure 1E:
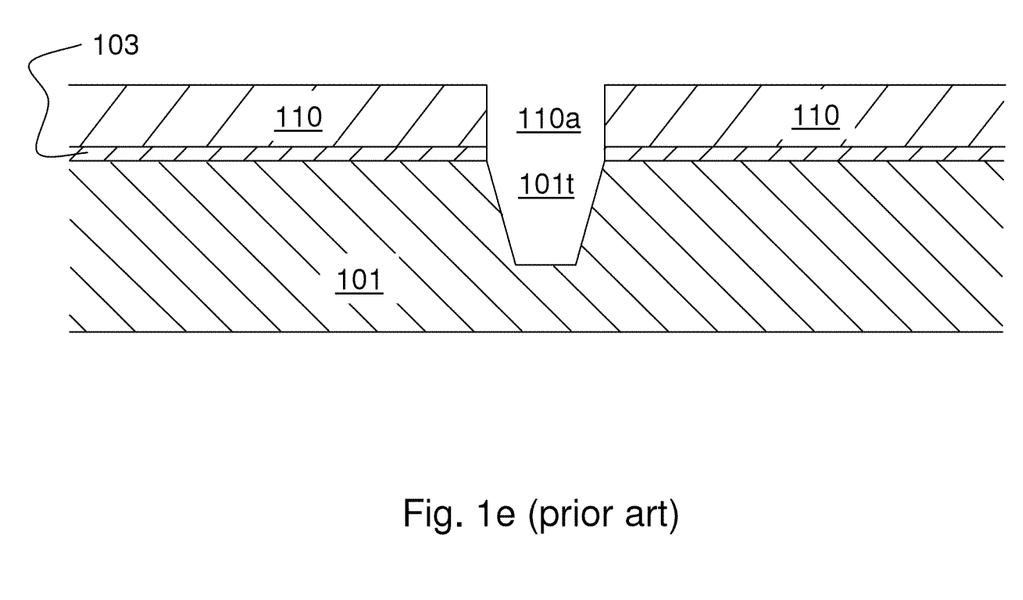

After forming the hard mask in nitride layer 110, an appropriate etching process is carried out in order to form trenches in substrate 101. FIG. 1e shows that, after completing this substrate etch, trenches 101t are formed in substrate 101 in correspondence to the apertures 110a in nitride layer 110.

Figure 1F:
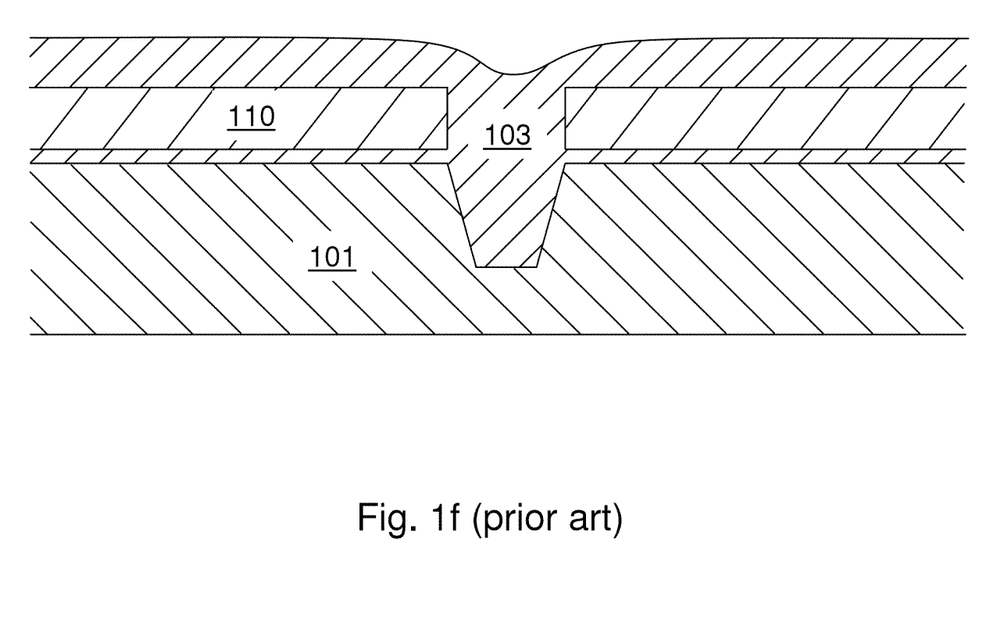

As shown in FIG. 1f, trenches 101t are filled with a dielectric material, which is typically the same oxide 103 as that initially grown on the surface of substrate 101. If the surface of substrate 101 is comprised of silicon, then oxide 103 may advantageously be silicon dioxide ($SiO_2$).

Figure 1G:
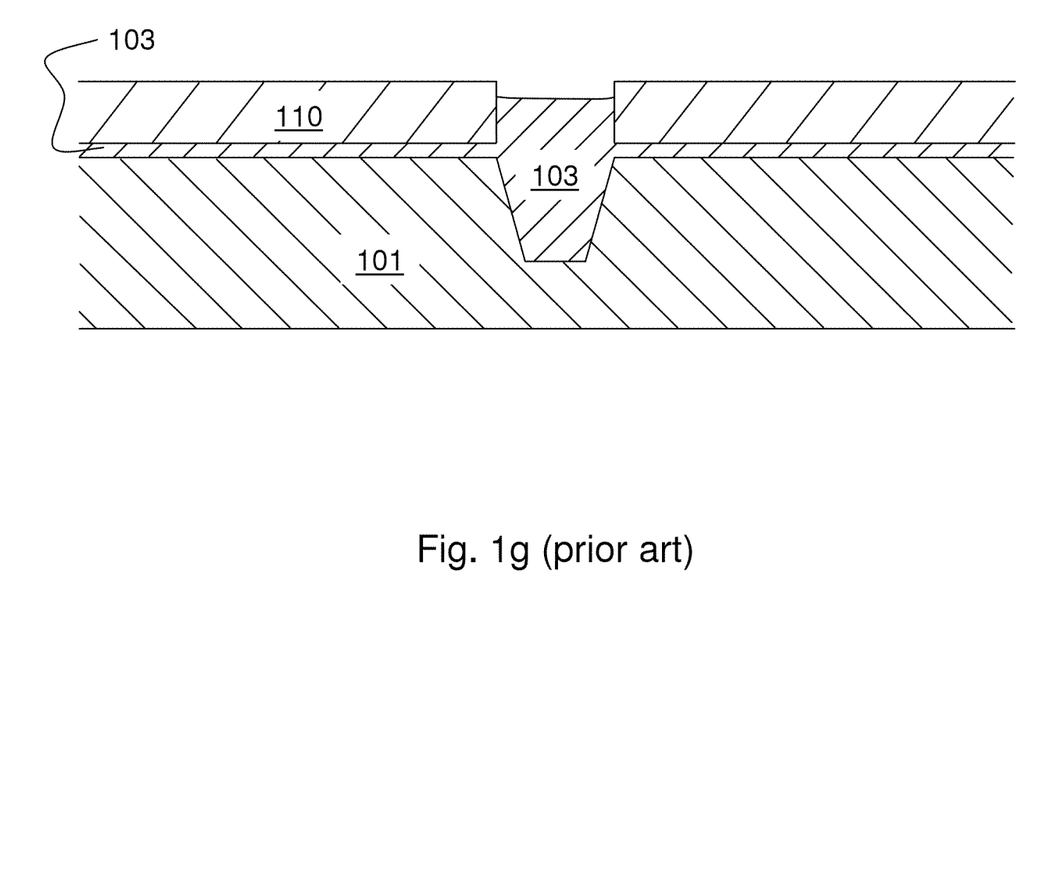

After depositing oxide 103 in order to fill trenches 101t, the excess material is removed, typically by using chemical mechanical polishing (CMP). FIG. 1g shows the system after performing excess material removal. During CMP, nitride layer 110 acts as an etch-stop layer.

Figure 1H:
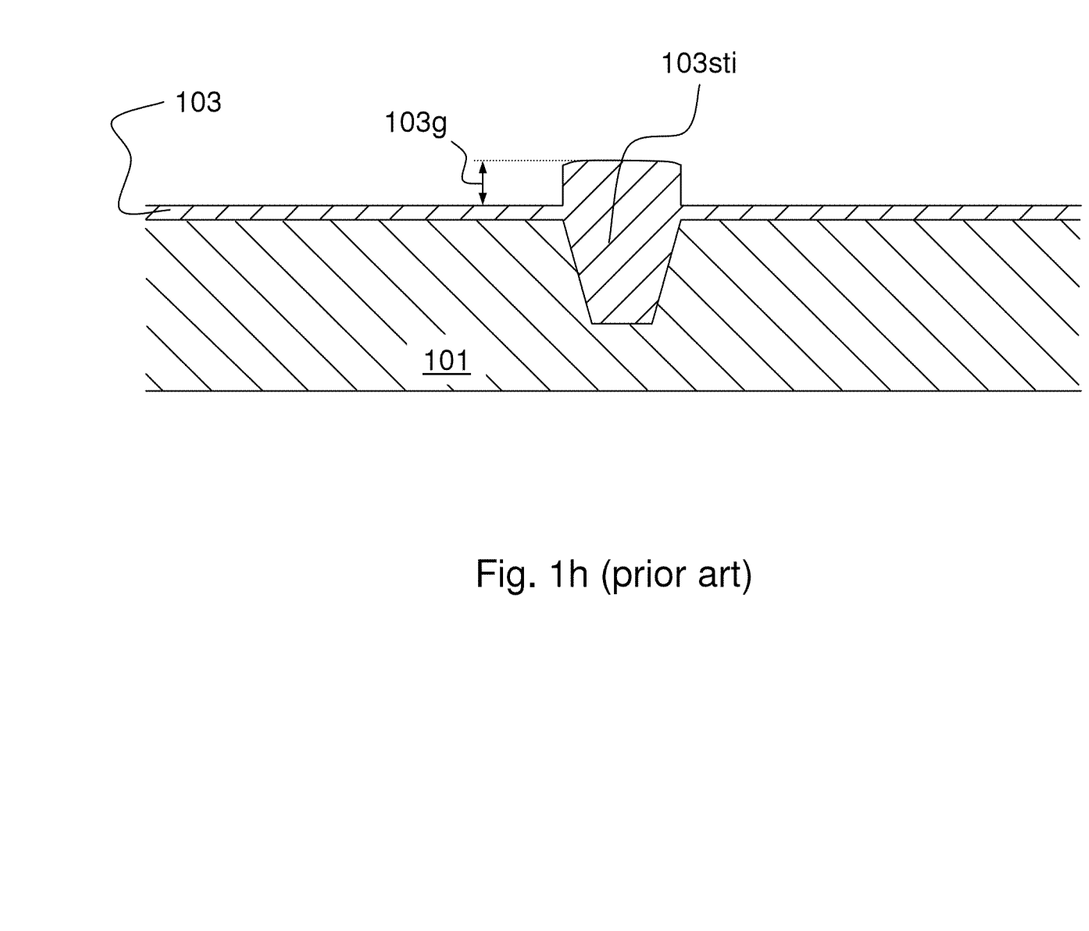

Finally, nitride layer 110 is removed and STI structures 103sti are formed as shown in FIG. 1h. Active regions (not shown) can subsequently be formed on opposite sides of STI structure 103sti.

As shown in FIG. 1h, STI structure 103sti forms a step on the surface of substrate 101 having a height 103g. This step is generated due to the presence of nitride layer 110 during the CMP performed so as to remove the excess oxide material and described with reference to FIG. 1g. Consequently, the step height 103g is nearly equal or slightly less than the thickness of nitride layer 110 in the vicinity of STI structure 103sti.

It is desirable that the steps formed by STI structures 103sti have as uniform as possible a height 103g across the entire surface of substrate 101. In order for this step height homogeneity to be achieved, it is crucial that the thickness of nitride layer 110 is uniform across the whole substrate 101.

Thus, a nitride layer 110 formed by means of a conventional deposition process as described above with reference to FIGS. 1a and 1b is not a satisfactory solution. As said above, during a conventional LPCVD process, reactant gases are normally depleted when flowing from the edge towards to center of a substrate. This results in a bowl-like shape of the deposited layer, i.e., a layer with a significantly larger thickness on the substrate edge than in the center. For example, the thickness difference of a deposited layer can be up to about 2 nm, for substrates positioned in the upper part of the reaction chamber farther away from the reactant gas inlets.

Several strategies have been implemented in the state of the art in order to contrast the reactant gas depletion towards the substrate center. Most of these strategies involve a temperature tilt across the substrate surface.

U.S. Pat. No. 6,461,979 proposes a solution consisting in ramping down the temperature in the reaction chamber during deposition. Although applicable to relatively short deposition times (less than 10-15 min), this solution cannot conveniently be pursued when longer deposition times (about 50 min or greater) are required, such as when depositing a nitride layer to be used as a hard mask during STI structure formation. For longer deposition times, a continuous temperature decrease would bring the reaction chamber temperature below the lower threshold of the process window for the nitride process well before the deposition ends. The process window is the range of process temperatures within which nitride deposition can be effectively carried out. When the process temperature decreases below the lower threshold of the process window, the deposition rate is reduced down to an excessively low value.

An alternative method is proposed by U.S. Pat. No. 6,537,677, which allows one to run a deposition above the lower threshold of the temperature process window. The proposed method consists of dividing the deposition into several stages, with the temperature being ramped down during each stage. Between consecutive ramping-down stages the temperature is to be increased while the deposition is interrupted. This solution is not satisfactory, since it requires a much longer process time due to the regular disruptions of the deposition process. This results in a lower throughput of the semiconductor device manufacturing process.

A further deposition method, described in U.S. Patent Application Publication No. 2009/0246371, relies on overheating the reaction chamber before starting the deposition in order to induce a temperature gradient across the substrate. Nitride deposition is carried out at a constant process temperature after the overheating. This method can be conveniently applied when forming relatively thin (approximately 10 nm) nitride layers, thus using short deposition times (approximately 15 min). However, when thicker (about 80 nm) nitride layers and longer deposition times (approximately 50 min) are required, this method fails to achieve its goals. This is mainly due to the fact that the temperature gradient across the substrate vanishes within the first stage of the deposition process (initial approximately 15 min), thus causing the subsequent second deposition stage (final approximately 35 min) to be run with a substantially homogeneous temperature across the substrate. Thus, during the second deposition stage the gas depletion from the edge to the center of the substrate cannot be compensated for by any temperature gradient. This causes the layer thickness to increase at the substrate edge with respect to the thickness in the substrate center during the second deposition stage, thereby finally resulting in a bowl-shaped deposited layer.

Yet other solutions could be envisaged in order to improve the uniformity of a nitride layer thickness upon deposition.

For example, one could run the deposition process with a double pitch boat load, in order for the larger spacing between consecutive substrates in the reaction chamber to considerably reduce gas depletion across the substrate. This solution is not satisfactory since it reduces the throughput by 50%.

Alternatively, the pressure during deposition could be reduced, so as to improve in-substrate uniformity. This solution entails the disadvantage of requiring a much longer deposition time, thereby also resulting in a reduced throughput.

In view of the drawbacks and disadvantages of the solutions known from the state of the art, there is a need for an improved method of growing material layers on a substrate surface with homogeneous properties, in particular with a homogeneous thickness. This need is particularly felt for nitride layers with a thickness greater than approximately 50 nm.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is based on the inventive idea that the traditional LPCVD deposition process used in order to form thin material layers may be improved by using a combination of an overheating of the reaction chamber and a cooling of the reaction chamber during a second deposition stage following. The second deposition stage follows a first deposition stage performed at a substantially constant temperature. Based on this idea a method of forming a material layer of a semiconductor device is provided. The method comprises inserting at least one substrate into a reaction chamber within which a process temperature can be established, overheating said at least one substrate comprising increasing said process temperature up to an overheating temperature greater than a predetermined first temperature, establishing said first temperature as a process temperature after said overheating, and forming said material layer onto said at least one substrate by introducing into said reaction chamber one or more precursor gases after increasing said process temperature up to said overheating temperature, wherein said forming said material layer comprises a first deposition stage performed at said first temperature and a second deposition stage performed after said first stage, wherein said process temperature is decreased from said first temperature to a second temperature less than said first temperature.

A method of forming an isolation structure in a semiconductor substrate is also provided.

Further preferred embodiments of the present invention are provided by the following description.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It should be understood that, unless otherwise specifically indicated, any relative positional or directional terms that may be used in the descriptions below—such as "upper", "lower", "on", "adjacent to", "above", "below", "over", "under", "top", "bottom", "vertical", "horizontal", and the like—should be construed in light of that term's normal and everyday meaning relative to the depiction of the components or elements in the referenced figures. For example, referring to the schematic cross-section of the reaction chamber 150 depicted in FIG. 1a, it should be understood that substrates 101 are "above" gas inlets 162 and that heating element 154ct is above heating element 154cb and below heating element 154t.

The present disclosure proposes an improved film deposition technique which can be used in conjunction with well-established deposition techniques such as CVD and LPCVD.

The proposed deposition method uses a reaction chamber which can be the reaction chamber 150 shown in FIG. 1a and described above with reference thereto. A plurality of deposition substrates 101 can be inserted into reaction chamber 150. Up to about 125 substrates 101 can be processed in reaction chamber 150 during a deposition run.

Substrates 101 may be any carrier appropriate for supporting a semiconductor device. During subsequent stages of the manufacturing flow not shown in this disclosure, each substrate 101 may be processed so as to form a semiconductor layer attached thereto. A densely integrated device comprising a plurality of FETs can then be manufactured partly in and partly on the semiconductor device. For example, substrates 101 may comprise semiconductor wafers. Some or all of substrates 101 may be transparent substrates, for example comprised of glass or a polymer. Substrates 101 may also include an oxide sandwiched between two semiconductor layers, such as the substrates for the silicon-on-oxide (SOI) technology.

Figure 2A:
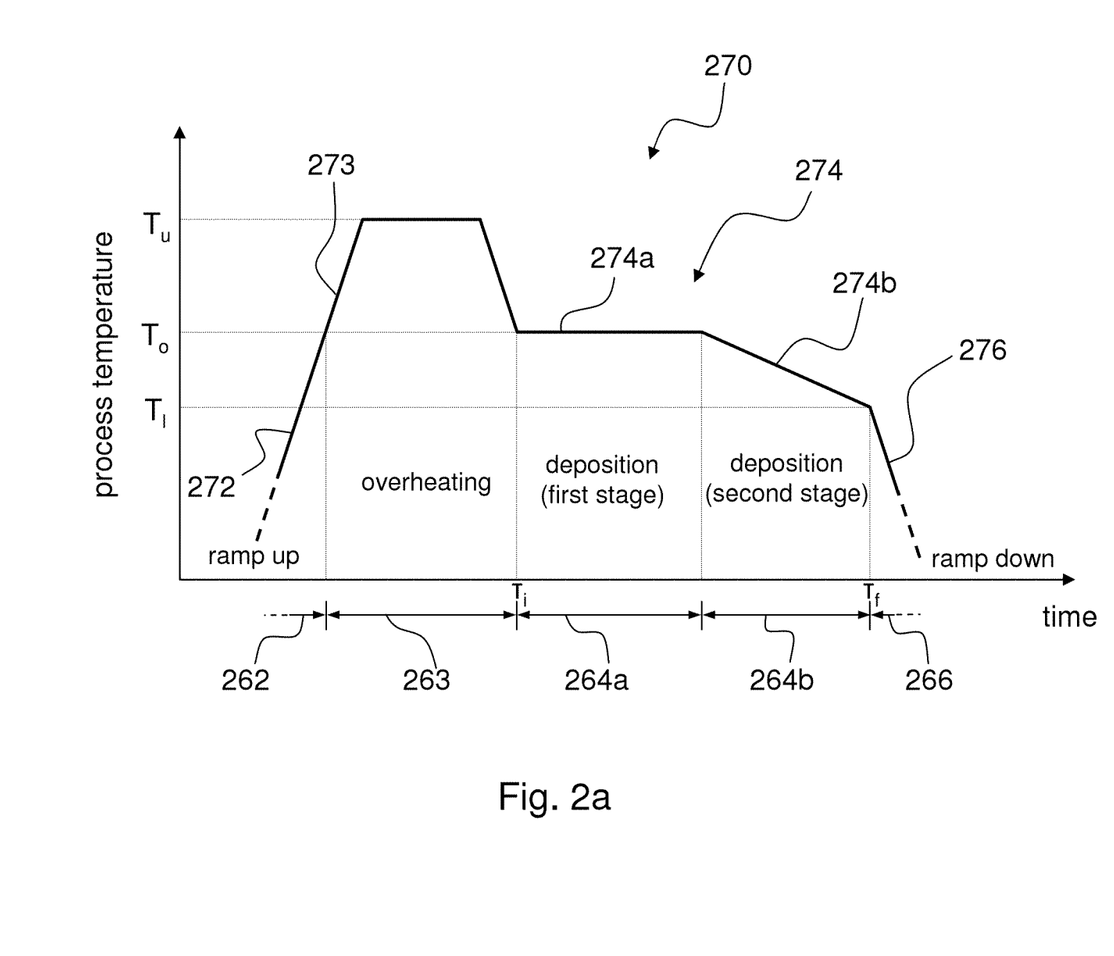
FIG. 2a shows a graph of reaction chamber temperature as a function of time for a deposition process according to an embodiment of the invention.

FIG. 2a shows a profile of process temperature versus process time during a layer formation process according to an embodiment of the invention. Line 270 shown in FIG. 2a should be understood as the process temperature in a determined portion of reaction chamber 150 shown in FIG. 1a as a function of time. For example, line 270 could indicate the temperature of one of the four heating elements 154b, 154cb, 154ct and 154t dividing reaction chamber 150 into four respective temperature zones.

Figure 2B:
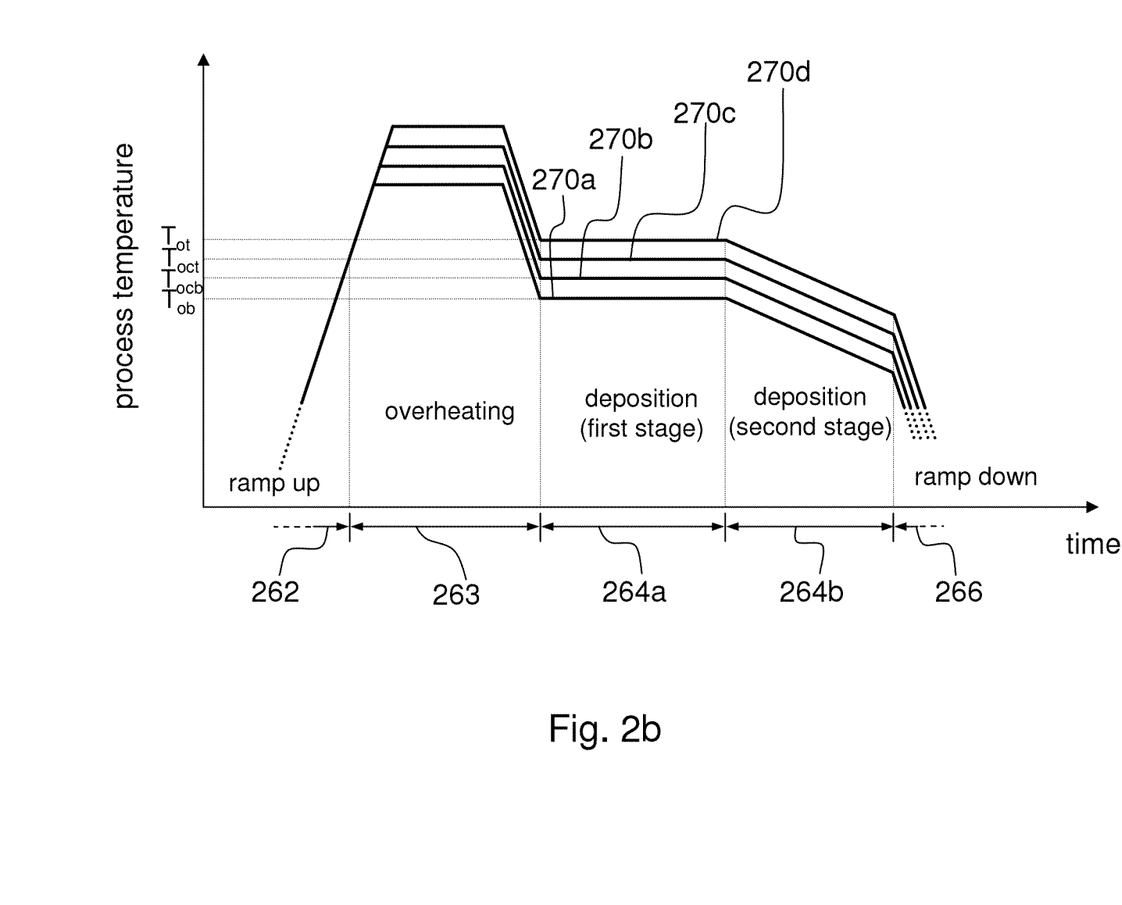
FIG. 2b shows a graph of reaction chamber temperature as a function of time for a deposition process according to a further embodiment of the invention.

The definition of "process temperature" provided above when discussing FIGS. 1a and 1b should be understood as being applicable in this context too and, in particular, during the discussion of FIGS. 2a and 2b. Thus, with reference to FIG. 1a, the reader is reminded that by the term "process temperature" the temperature of the interior of reaction chamber 105 should be understood. Furthermore, the reader is also reminded that the process temperature at a given point of the reaction chamber belonging to a particular temperature zone is considered to be fairly approximated by the temperature of the heating element 154b, 154cb, 154ct and 154t associated with that particular temperature zone.

With reference to FIG. 2a, after inserting the substrates into the reaction chamber, the process temperature is gradually increased for a time interval 262, as indicated by segment 272 of line 270. Temperature increase 272 may be performed while an inert gas, such as $N_2$ and the like, flows in the reaction chamber. Temperature increase 272 is continued up to a predetermined main operation temperature $T_o$ to be used during a first deposition stage 274a, as will be explained more extensively in the following. For example, when depositing a nitride such as $Si_3N_4$, $T_o$ can be in the range of approximately 740° C. to approximately 780° C.

After operation temperature $T_o$ has been reached, a substrate in the reaction chamber is overheated by increasing the process temperature further up to a predetermined overheating temperature $T_u$, as indicated by the first portion of segment 273 of line 270. Overheating temperature $T_u$ is greater than operation temperature $T_o$. In embodiments, overheating temperature $T_u$ is 10° C. to 30° C. higher than operation temperature $T_o$. After reaching overheating temperature $T_u$, this can be maintained for a certain amount of time so as to stabilize the temperature in the substrate, as shown by the middle, horizontal portion of segment 273. During the last phase of overheating 273, the temperature is decreased down to main operation temperature $T_o$, as shown by the third portion of segment 273 indicating a temperature downhill ramp.

In general, overheating 273 comprises an ascending-temperature phase, during which the process temperature is increased up to overheating temperature $T_u$, followed by a descending-temperature phase, during which the process temperature is decreased from overheating temperature $T_u$ down to operation temperature $T_o$. At the end of overheating 273, operation temperature $T_o$ is established as a process temperature in the reaction chamber.

In the embodiment shown in FIG. 2a, film deposition starts at time $\tau_i$, shortly after overheating 273 is completed and upon establishing operation temperature $T_o$ in the reaction chamber.

Overheating 273, carried out within a time interval 263, results in formation of a temperature gradient across the substrate. This is due to the fact that edge regions of the substrate respond faster to change of thermal conditions in the reaction chamber than central regions. Thus, when decreasing the process temperature after reaching overheating temperature $T_u$, the temperature of edge regions of the substrate decreases faster than the temperature of the substrate center.

Therefore, at the end of overheating 273 at time $\tau_i$, the temperature of the substrate is higher around the center than at the edge. A temperature gradient is then established across the substrate parallel to the substrate surface and radially directed towards the substrate center. Thus, as a result of overheating 273, the temperature steadily decreases when moving from the center to the edge of the substrate.

At time $\tau_i$ film deposition is initiated by introducing the desired reactant gases into the reaction chamber through dedicated gas inlets, such as inlets 152 of reaction chamber 150 shown in FIG. 1a. If the film to be deposited is comprised of $Si_3N_4$, the reactant gases comprise ammonia ($NH_3$) and dichlorosilane ($SiH_2Cl_2$).

It should be understood that, although in the embodiment shown in FIG. 2a deposition is initiated immediately upon establishing operation temperature $T_o$ following overheating 273, other embodiments are possible wherein deposition is initiated already during overheating 273 and, more precisely, at a predetermined point along the downhill temperature ramp of overheating 273 bringing the process temperature from overheating temperature $T_u$ down to operation temperature $T_o$. Furthermore, in yet other embodiments, deposition can be started after time $\tau_i$, i.e., the deposition process may start after a predetermined time delay from the time when operation temperature $T_o$ has been established following overheating 273.

The crucial point is that at the beginning of the deposition a temperature gradient is established across the substrate, in such a manner that the temperature decreases when moving from the center to the edge of the substrate. However, the initial intensity of this temperature gradient may be chosen at will. The intensity of the temperature gradient is expected to increase during the downhill temperature-ramp of overheating 273. Conversely, the intensity of the temperature gradient decreases during the horizontal segment 274a, as explained more extensively in the following. Therefore, in the embodiment shown in FIG. 2a the deposition is started in correspondence to the maximum intensity of the temperature gradient across the substrate. However, some applications may require the temperature gradient intensity to be initially lower than the maximum intensity achieved. In this case, deposition may be started before or after time $\tau_i$, depending on the desired variation of the gradient intensity as a function of time.

Again with reference to FIG. 2a, the film deposition process is divided into two subsequent stages indicated by segments 274a and 274b of line 270, respectively.

The first deposition stage 274a is carried out for a time interval 264a starting from time $\tau_i$. During first deposition stage 274a, the process temperature in the reaction chamber is maintained at a constant value equal to $T_o$. The temperature gradient previously established across the substrate permits a compensation for the reactant gas depletion occurring when the gas flows from the edge to the center of the substrate. This results in deposition of layers having a more uniform thickness, with respect to the constant-temperature method followed in the prior art.

In the course of first deposition stage 274a the intensity of the temperature gradient tends to decrease across the substrate, due to the fact that the temperature across the substrate tends to equilibrate to a uniform value equal to the operation temperature $T_o$. For a typical substrate, e.g., a Si wafer, the temperature is equalized across the whole substrate to operation temperature $T_o$ within a time interval of approximately 15 min. The compensating effect for the reactant gas depletion across the substrate tends to disappear with a vanishing temperature gradient across the substrate.

In order to re-establish a temperature gradient across the substrate compensating for the reactant gas depletion from the edge to the center of the substrate, the present invention proposes a second deposition stage 274b, during which the process temperature is decreased from operation temperature $T_o$ down to a predetermined final temperature $T_1$, which is lower than operation temperature $T_o$. In embodiments, final temperature $T_1$ is less than operation temperature $T_o$ by approximately 10° C. to 30° C. Second deposition stage 274b has a predetermined time duration 264b.

According to the embodiment shown in FIG. 2a the process temperature is decreased linearly from operation temperature $T_o$ down to final temperature $T_1$ throughout second deposition stage 274b. In alternative embodiments the rate of temperature decrease does not have to be necessarily constant throughout second deposition stage 274b and any appropriate substantially decreasing temperature profile may be used during second deposition stage 274b.

The downhill ramp of second deposition stage 274b results in formation of a temperature gradient across the substrate, with the temperature decreasing from the substrate center to the edge. This is due, as explained above, to the faster response of the substrate edge to variations of process temperature as compared to the substrate center. Again as explained above, this temperature gradient is capable of compensating for the depletion of reactant gases from the edge to the center of a single substrate, which normally occurs in CVD reaction chambers.

Conveniently, second deposition stage 274b may be designed in order that a moderate temperature gradient is established across the substrate. Furthermore, the process temperature could be advantageously reduced during deposition stage 274b in order that the temperature gradient is approximately constant or slowly changing in time. For this reason, a temperature decrease at a constant rate in time may be preferred in some applications to other forms of temperature variations over time. In embodiments, the rate at which the process temperature decreases during second deposition range 274b is in the range of approximately 0.2° C./min to approximately 1° C./min.

On the other hand, in some other applications it might be advantageous if the process temperature decreases at different rates during second deposition stage 274b. For example, the process temperature might decrease faster during the initial part of second deposition stage 274b, when the process temperature is higher and slower during the final part, when the process temperature is lower. This would result in a relatively strong temperature gradient across the substrate during the initial part of second deposition stage 274b and a weaker gradient during the final part thereof. In this manner, the effect of the temperature gradient, resulting in a compensation for the reactant gas depletion towards the substrate center, could be concentrated in the initial part of second deposition stage 274b, during which the process temperature and the layer growth rate are higher than in the final part.

After completing the second deposition stage 274b, the reactant gases are prevented from entering the reaction chamber by closing the inlets at time $\tau_f$. This concludes the film deposition process. In the embodiment shown in FIG. 2a, the deposition is interrupted upon establishing the final temperature $T_1$ as a process temperature in the reaction chamber. However, in other embodiments the deposition could be continued for a predetermined time interval after reaching final temperature $T_1$.

After concluding the deposition process, the temperature in the reaction chamber is ramped down, as shown by segment 276 of line 270. During temperature ramp-down 276, performed during a time interval 266, purge gases may be allowed to flow in the reaction chamber. Purge gases may comprises one or more inert gases. A typical inert gas which can be used is $N_2$. Finally, at the end of downhill temperature-ramp 276, the substrate with the newly deposited film can be removed from the reaction chamber (not shown).

The present disclosure proposes a novel, advantageous film deposition method based on a sophisticated combination of an overheating before deposition and a cooling of the reaction chamber during a second deposition stage. The second deposition stage follows a first deposition stage preferably carried out at a predetermined temperature. This combination makes it possible to compensate for the reactant gas depletion across the wafer throughout the whole deposition process, irrespective of the deposition time duration. A considerable improvement in thickness homogeneity of the deposited films can thus be achieved across the whole wafer surface, without having to decrease the throughput or the growth rate with respect to a conventional film formation process.

The method of forming a thin film described above with reference to FIG. 2a can be advantageously used when forming a nitride layer, in particular a $Si_3N_4$ layer, on a pad oxide grown on the surface of a semiconductor layer. Such a nitride layer is commonly used during a semiconductor device manufacturing flow as a hard mask when defining isolation regions such as STI regions in a substrate. This process has been described above with reference to FIG. 1c-1h. For example, the film formation method according to the present invention can be used during deposition 181 shown in FIG. 1d and resulting in nitride layer 110.

More specifically, deposition 181 may be carried out as a LPCVD, wherein the temperature of at least one temperature zone of the reaction chamber follows the profile of line 270 shown in FIG. 2a. The thickness of the deposited nitride film is preferably of approximately 80 nm. Where needed, the thickness of the deposited nitride film could be greater than 80 nm. When depositing a nitride layer such as layer 110 shown in FIG. 1d, the total deposition time (difference between final deposition time $\tau_f$ and initial deposition time $\tau_i$ in FIG. 2a) is preferably of approximately 50 min. In embodiments, the time duration 264a of first deposition stage 274a is in the range of approximately 10 to 20 min and, preferably, of approximately 15 min. Furthermore, the time duration 264b of second deposition stage 274b is in the range of approximately 30 to 40 min and, preferably, of approximately 35 min.

Nitride layers formed according to this embodiment have a much greater in-wafer thickness uniformity as compared to nitride layers formed according to the conventional method. This point will be quantitatively illustrated in the following. When used as hard masks for STI formation, nitride layers formed according to the new method cause the fluctuation in STI step-height to decrease considerably across the wafer.

FIG. 2b shows a further embodiment, wherein the reaction chamber used for the film formation process is divided into several temperature zones. Preferably, the temperature varies along a longitudinal axis of the reaction chamber, whereas it is uniform across a plane orthogonal to the longitudinal axis, as described above with reference to FIG. 1a. During film formation, the substrates are stacked upon each other in the reaction chamber along the longitudinal axis.

FIG. 2b shows that the reaction chamber is divided into four temperature zones, each following a temperature profile described by lines 270a-270d, respectively. The reaction chamber may alternatively be divided into a number of temperature zones different from four. Preferably, the temperature zones are placed above each other along the longitudinal axis of the reaction chamber. Preferably, the process temperature of the temperature zones increases with an increasing distance from the gas inlets. Since gas inlets are usually placed at the bottom of the reaction chamber, the process temperature in the reaction chamber preferably increases when moving from the bottom to the top region of the reaction chamber. In embodiments, lines 270a, 270b, 270c, 270d shown in FIG. 2b indicate the temperature profiles of bottom heating element 154b, center-bottom heating element 154cb, center-top heating element 154ct, top heating element 154t of reaction chamber 150 shown in FIG. 1a, respectively.

Lines 270a-270d follow the same pattern as line 270 shown in FIG. 2a. Again with reference to FIG. 2b, all temperature profiles 270a-270d start with a temperature ramp-up with a time duration 262, followed by an overheating up to an appropriate overheating temperature which is greater than the respective operation temperature chosen for each temperature zone. The operation temperatures of temperature profiles 270a-270d are indicated as $T_{ob}$, $T_{ocb}$, $T_{oct}$ and $T_{oct}$ in FIG. 2b, respectively.

Overheating, which has a time duration indicated by time interval 263 in FIG. 2b, is followed by a first deposition stage performed at a predetermined operation temperature $T_{ob}$, $T_{ocb}$, $T_{oct}$ and $T_{ot}$ different for each temperature zone. If lines 270a-270d represent the temperature profiles of the heating elements of reaction chamber 150 shown in FIG. 1a, as in the embodiment described above, then Tob, $T_{ocb}$, $T_{oct}$ and $T_{ot}$ may be conveniently equal to (740±5)° C., (750±5)° C., (770±5)° C. and (780±5)° C., respectively.

Still with reference to FIG. 2b, the first deposition stage is performed for a time interval 264a and is followed by a second deposition stage, wherein during a time interval 264b the temperature is decreased down to a final temperature which is again different depending on the temperature profile 270a-270d.

In embodiments, the overheating temperature of each temperature profile 270a-270d is 10° C. to 30° C. higher than the respective operation temperature $T_{ob}$, $T_{ocb}$, $T_{oct}$ and $T_{ot}$. Furthermore, in embodiments the final temperature reached at the end of the second deposition stage by each temperature profile 270a-270d is 10° C. to 30° C. lower than the respective operation temperature $T_{ob}$, $T_{ocb}$, $T_{oct}$ and $T_{ot}$.

Dividing the reaction chamber into different temperature zones offers one the possibility of compensating for the depletion of reactant gases occurring during gas flow from the inlet, usually located at the bottom of the reaction chamber, towards the top region of the reaction chamber. Reactant gas depletion can thus be compensated for by gradually increasing the reaction chamber temperature when moving from bottom to top regions thereof. Thus, the advantageous improvement of in-wafer thickness uniformity achieved by means of the method described with reference to FIG. 2a is accompanied by an improved thickness homogeneity among substrates loaded in different areas of a reaction chamber during a deposition run.

Figures 3A, 3B, 3C:
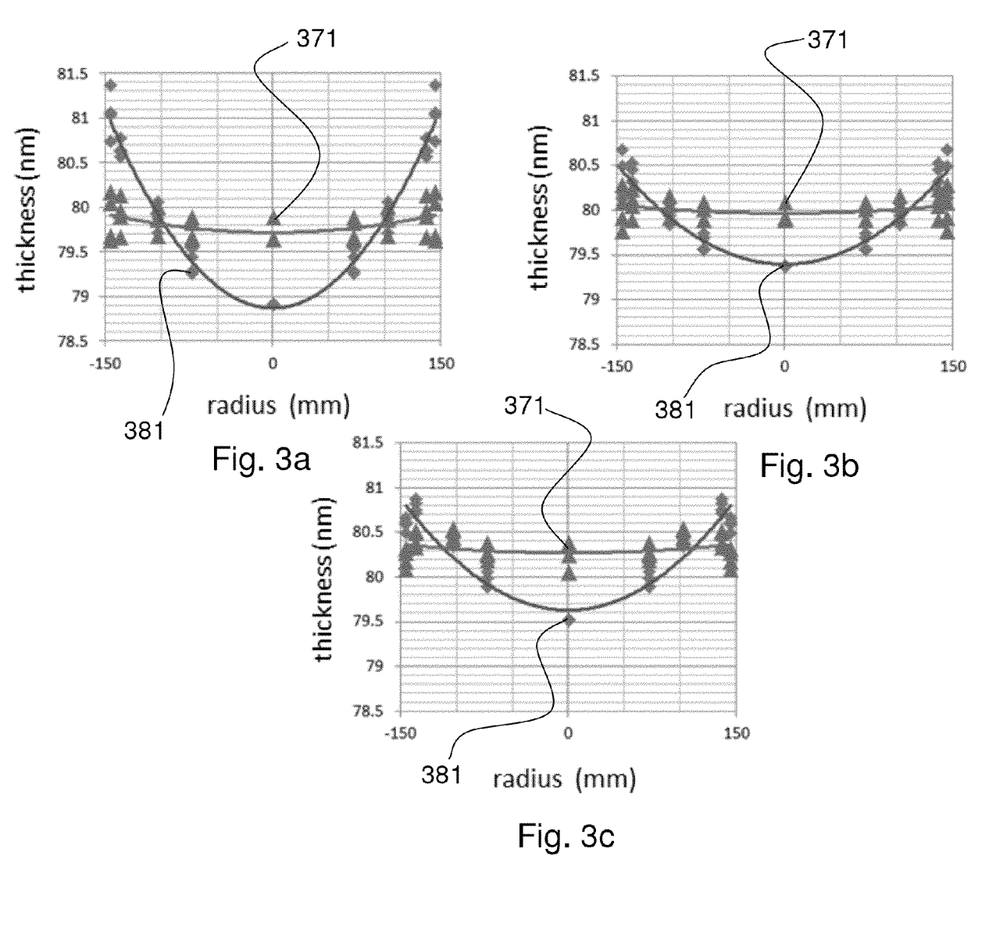
FIG. 3a shows a plot of the thickness of two nitride layers as a function of the radial distance from the center of the substrate. The two nitride layers were formed by means of a conventional LPCVD process and by means of a deposition process according to an embodiment of the present invention, respectively, with the substrate arranged in an upper portion of the reaction chamber.
FIG. 3b shows a plot of the thickness of two nitride layers as a function of the radial distance from the center of the substrate. The two nitride layers were formed by means of a conventional LPCVD process and by means of a deposition process according to an embodiment of the present invention, respectively, with the substrate arranged in a central portion of the reaction chamber.
FIG. 3c shows a plot of the thickness of two nitride layers as a function of the radial distance from the center of the substrate. The two nitride layers were formed by means of a conventional LPCVD process and by means of a deposition process according to an embodiment of the present invention, respectively, with the substrate arranged in a lower portion of the reaction chamber.

FIGS. 3a-3c compare the performance of the method according to the present invention with that of the conventional deposition method. In FIGS. 3a-3c diamonds 381 indicate the local thickness of three respective $Si_3N_4$ layers grown during the same conventional deposition run. Furthermore, triangles 371 indicate the local thickness of three respective $Si_3N_4$ layers grown in the course of the same deposition run by following the method according to the present invention. In particular, the division into temperature zones as described with reference to FIG. 2b was used when growing the $Si_3N_4$ layers whose thickness is plotted in FIGS. 3a-3c. In both deposition runs, $Si_3N_4$ films of a thickness of approximately 80 nm were formed onto a thin $SiO_2$ layer previously formed on the surface of a respective Si substrate. The continuous lines in FIGS. 3a-3c were obtained by interpolating the experimental data.

The data plotted in FIG. 3a relate to substrates located in a top area of the reaction chamber, relatively far from the reactant gas inlets. The plots in FIG. 3b relate to substrates located in a middle area of the reaction chamber. Finally, the plots in FIG. 3c relate to substrates located in a bottom area of the reaction chamber, in the vicinity of the reactant gas inlets.

As shown in FIGS. 3a-3c, the proposed method is able to improve the in-wafer thickness uniformity by over 60% with respect to the known method. Irrespective of the substrate position in the reaction chamber, the fluctuation in thickness of all three $Si_3N_4$ films shown in FIGS. 3a-3c and obtained by means of the proposed method was well below 1 nm. In particular, for each of the three films whose local thicknesses are plotted as triangles 371, one can observe that, given any two points across the film surface, the difference in film thickness at those two points was below 1% of the average film thickness. More precisely, the thickness difference between any two points of a film obtained by means of the proposed method was in all cases in the range of approximately 0.6% to 0.8% of the average thickness.

The data shown in FIGS. 3a-3c show that unprecedented thickness uniformity may be achieved also when depositing layers of a thickness greater than about 50 nm, a thickness range in which the known methods fail in producing sufficiently homogeneous layers. It should be noticed that by means of the herewith disclosed invention improved film homogeneity is achieved neither by reducing the throughput, nor by increasing the deposition time. Conversely, throughput and deposition times characteristic of the proposed method are at least comparable to those of the known method.

Since the improvement in in-wafer homogeneity can be obtained irrespective of the deposition times and the thickness of the deposited layer, the present invention can be conveniently applied to material layers requiring relatively long deposition times, e.g., deposition times greater than approximately 20 min, resulting in layers with a thickness greater than about 50 nm. In particular, the proposed method may be conveniently applied to deposition of films performed for a duration of approximately 50 min or greater, resulting in a film thickness of approximately 80 nm or greater. This is the case with $Si_3N_4$ films used as hard masks during STI region formation.

Although such an application has been described above, the present invention can as well be conveniently applied in other stages of a semiconductor device manufacturing process flow, and not necessarily for forming $Si_3N_4$ films. A vast number of dielectric and semiconductor layers may be formed on a substrate by using the present invention. These include, for example, oxide layers, low-k material layers, semiconductor layers, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:
1. A method of forming a material layer of a semiconductor device, the method comprising:
    inserting at least one substrate into a reaction chamber within which a process temperature can be established;
    overheating said at least one substrate comprising increasing said process temperature up to an overheating temperature greater than a predetermined first temperature;

establishing said first temperature as a process temperature after said overheating; and forming said material layer onto said at least one substrate by introducing into said reaction chamber one or more precursor gases after increasing said process temperature up to said overheating temperature;

wherein said forming said material layer comprises:

a first deposition stage performed at said first temperature; and a second deposition stage performed after said first deposition stage, wherein said process temperature is decreased from said first temperature to a second temperature less than said first temperature.

2. A method as claimed in claim 1, wherein said forming said material layer is performed after said overheating.

3. A method as claimed in claim 2, wherein said forming said material layer is performed upon said establishing said first temperature as the process temperature.

4. A method as claimed in claim 1, wherein a difference between said overheating temperature and said first temperature is in the range of 10° C. to 30° C.

5. A method as claimed in claim 1, wherein a difference between said first temperature and said second temperature is in the range of 10° C. to 30° C.

6. A method as claimed in claim 1, wherein said second deposition stage is performed within a predetermined time interval.

7. A method as claimed in claim 1, wherein said process temperature is decreased at a constant rate during said second deposition stage.

8. A method as claimed in claim 1, wherein said forming said material layer is interrupted upon reaching said second temperature.

9. A method as claimed in claim 1, wherein said forming said material layer is performed for a time duration in the range of approximately 40 min to 60 min.

10. A method as claimed in claim 1, wherein said forming said material layer is performed for a total time duration of approximately 50 min.

11. A method as claimed in claim 1, wherein a time duration of said first deposition stage is in the range of approximately 10 min to 20 min.

12. A method as claimed in claim 1, wherein a time duration of said second deposition stage is in the range of approximately 30 min to 40 min.

13. A method as claimed in claim 1, wherein a final thickness of said material layer is greater than or equal to approximately 50 nm.

14. A method as claimed in claim 1, wherein a final thickness of said material layer is approximately 80 nm or greater.

15. A method as claimed in claim 1, wherein a difference in thickness between any two points of said material layer is not greater than about 1% of an average thickness.

16. A method as claimed in claim 1, wherein said material layer comprises silicon nitride ($Si_3N_4$).

17. A method as claimed in claim 1, wherein said at least one substrate comprises a plurality of substrates placed at different positions within said reaction chamber, and wherein said overheating temperature, first temperature and second temperature are different at different positions within said reaction chamber.

18. A method as claimed in claim 1, wherein said overheating temperature, first temperature and second temperature increase with an increased distance from an inlet used for introducing said precursor gases.

19. A method as claimed in claim 1, further comprising:

forming an oxide layer on a surface of said substrate before forming said material layer; and forming said material layer onto said oxide layer.

20. A method of forming an isolation region in a semiconductor substrate, the method comprising:

forming an oxide layer on a surface of said semiconductor substrate;

forming a nitride layer on a surface of said oxide layer, wherein said forming comprises:

positioning said semiconductor substrate into a reaction chamber within which a process temperature can be established;

overheating said semiconductor substrate, wherein said overheating comprises increasing said process temperature up to an overheating temperature greater than a predetermined first temperature;

establishing said first temperature as a process temperature after said overheating; and forming said nitride layer onto said semiconductor substrate by introducing into said reaction chamber one or more precursor gases after increasing said process temperature up to said overheating temperature;

wherein said forming said nitride layer comprises:

a first deposition stage performed at said first temperature; and a second deposition stage performed after said first deposition stage, wherein said process temperature is decreased from said first temperature to a second temperature less than said first temperature;

patterning said oxide layer and said nitride layer to form at least an aperture;

performing an etch in the presence of said patterned oxide layer and nitride layer to form a trench in said semiconductor substrate;

filling said trench with a dielectric material; and removing said nitride layer.

* * * * *